(12) United States Patent
Chiang et al.

(10) Patent No.: US 7,998,818 B2
(45) Date of Patent: Aug. 16, 2011

(54) METHOD FOR MAKING SEMICONDUCTOR ELEMENT STRUCTURE

(75) Inventors: Tian-Fu Chiang, Taipei (TW); Li-Wei Cheng, Hsin-Chu (TW); Che-Hua Hsu, Hsin-Chu Hsien (TW); Chih-Hao Yu, Tainan County (TW); Cheng-Hsien Chou, Tainan County (TW); Chien-Ming Lai, Tainan County (TW); Yi-Wen Chen, Tainan County (TW); Chien-Ting Lin, Hsin-Chu (TW); Guang-Hwa Ma, Hsinchu (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 12/862,799

(22) Filed: Aug. 25, 2010

(65) Prior Publication Data

US 2010/0317182 A1    Dec. 16, 2010

Related U.S. Application Data

(62) Division of application No. 12/033,017, filed on Feb. 19, 2008, now Pat. No. 7,804,141.

(51) Int. Cl.
*H01L 21/336* (2006.01)

(52) U.S. Cl. ........ 438/279; 438/275; 257/407; 257/365; 257/388; 257/406; 257/413

(58) Field of Classification Search .................. 438/275, 438/279; 257/288–413, 900, 901
See application file for complete search history.

(56) References Cited

U.S. PATENT DOCUMENTS

| | | | |
|---|---|---|---|
| 6,291,282 B1 | 9/2001 | Wilk |
| 6,406,956 B1 | 6/2002 | Tsai |
| 6,514,827 B2 | 2/2003 | Kim |
| 6,653,698 B2 | 11/2003 | Lee |
| 6,849,511 B2 | 2/2005 | Iriyama et al. |
| 7,045,428 B2 | 5/2006 | Brask et al. |
| 7,074,664 B1 | 7/2006 | White |
| 7,078,282 B2 | 7/2006 | Chau |
| 7,098,516 B2 | 8/2006 | Colombo |
| 2005/0054149 A1 | 3/2005 | Xiang |
| 2005/0095763 A1 | 5/2005 | Samavedam |
| 2008/0272435 A1 | 11/2008 | Lin |
| 2009/0181504 A1 | 7/2009 | Lin |

*Primary Examiner* — Mary Wilczewski
*Assistant Examiner* — Telly D Green
(74) *Attorney, Agent, or Firm* — Winston Hsu; Scott Margo (57) ABSTRACT

A method for forming a semiconductor element structure is provided. First, a substrate including a first MOS and a second MOS is provided. The gate electrode of the first MOS is connected to the gate electrode of the second MOS, wherein the first MOS includes a first high-K material and a first metal for use in a first gate, and a second MOS includes a second high-K material and a second metal for use in a second gate. Then the first gate and the second gate are partially removed to form a connecting recess. Afterwards, the connecting recess is filled with a conductive material to form a bridge channel for electrically connecting the first metal and the second metal.

12 Claims, 6 Drawing Sheets

METHOD FOR MAKING SEMICONDUCTOR ELEMENT STRUCTURE

CROSS REFERENCE TO RELATED APPLICATIONS

This application is a divisional application of and claims the benefit of U.S. patent application Ser. No. 12/033,017, filed Feb. 19, 2008.

BACKGROUND OF THE INVENTION

1. Field of the Invention

The present invention relates to a semiconductor element structure and a method for forming the semiconductor element structure. More particularly, the present invention relates to a semiconductor element structure with an inter-gate bridge channel and a method for forming the semiconductor element structure.

2. Description of the Prior Art

The gate electrodes in a PMOS and NMOS of a static random access memory (SRAM) based on the complementary metal-oxide semiconductor (CMOS) structure are usually connected to each other. If such devices are manufactured by a high-K/metal gate replacement procedure, however, the poly-Si and the gate dielectric layer in the gates of the PMOS and the NMOS is removed in different steps to be replaced by the corresponding conductive metal gate and gate dielectric layer. Just after the deposition of the high-K materials and the metal gate materials, the electric connection between the metal gates in the PMOS and the NMOS is lost due to the isolation formed by the high-K materials. Therefore, a technical strategy is needed to restore the electric connection between the metal gates in the PMOS and the NMOS.

Figure 1:
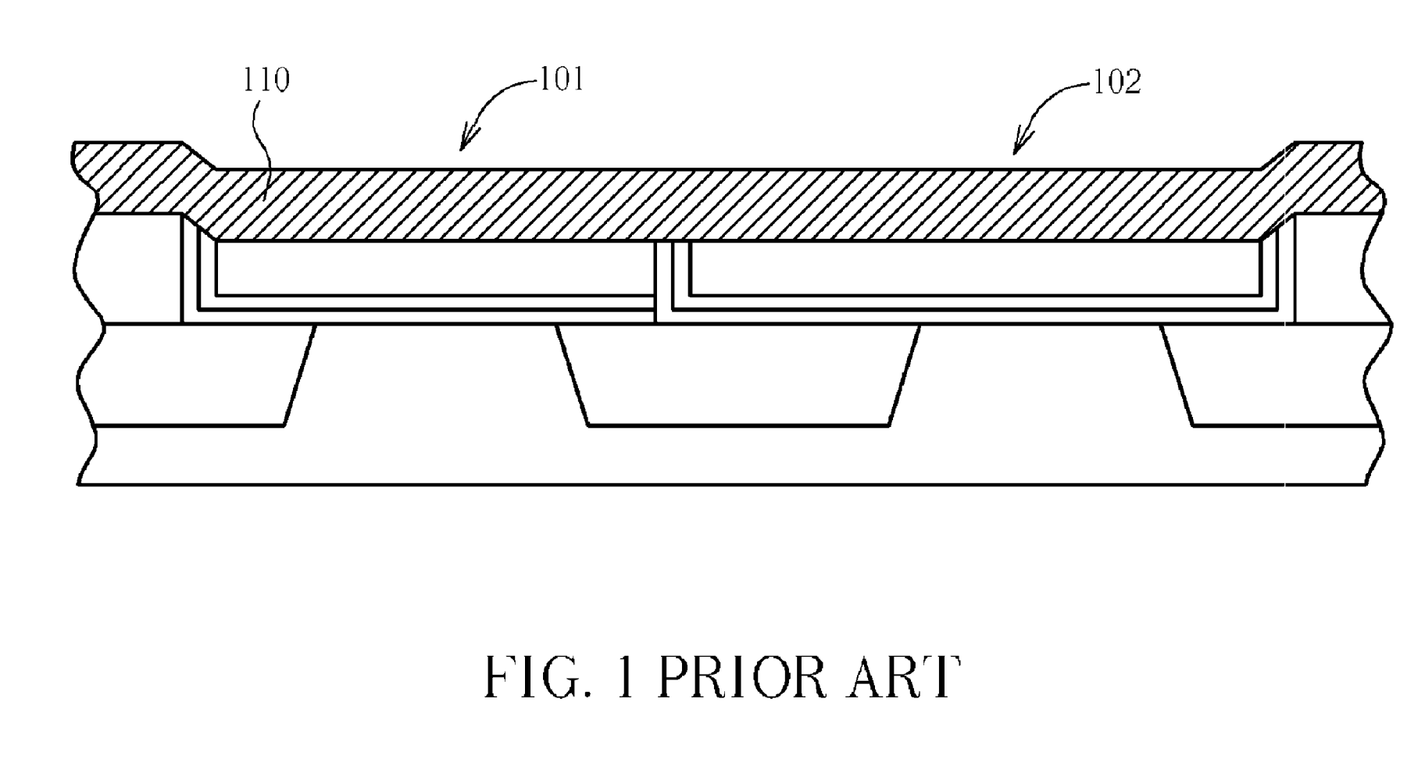
FIG. 1 illustrates a first electrical connection plan for electrically connecting the metal gates in a PMOS and NMOS in the prior art.

An electrical connection plan is provided in U.S. Pat. No. 6,849,511. A dishing phenomenon is available on the surface of the material with higher removal rate by taking advantage of different removal rates between different materials by CMP and this area is taken as the space for the electrical connection material for the metal gates in the PMOS 101 and the NMOS 102, as shown in FIG. 1. Because, however, such a dishing space is too thin to be a suitable electrical connection as well as to be easily controlled and to stably and effectively maintain a sufficient electrical connection for the metal gates in the PMOS 101 and the NMOS 102, only an electrical connection with overly high electrical resistance is obtained.

Figure 2:
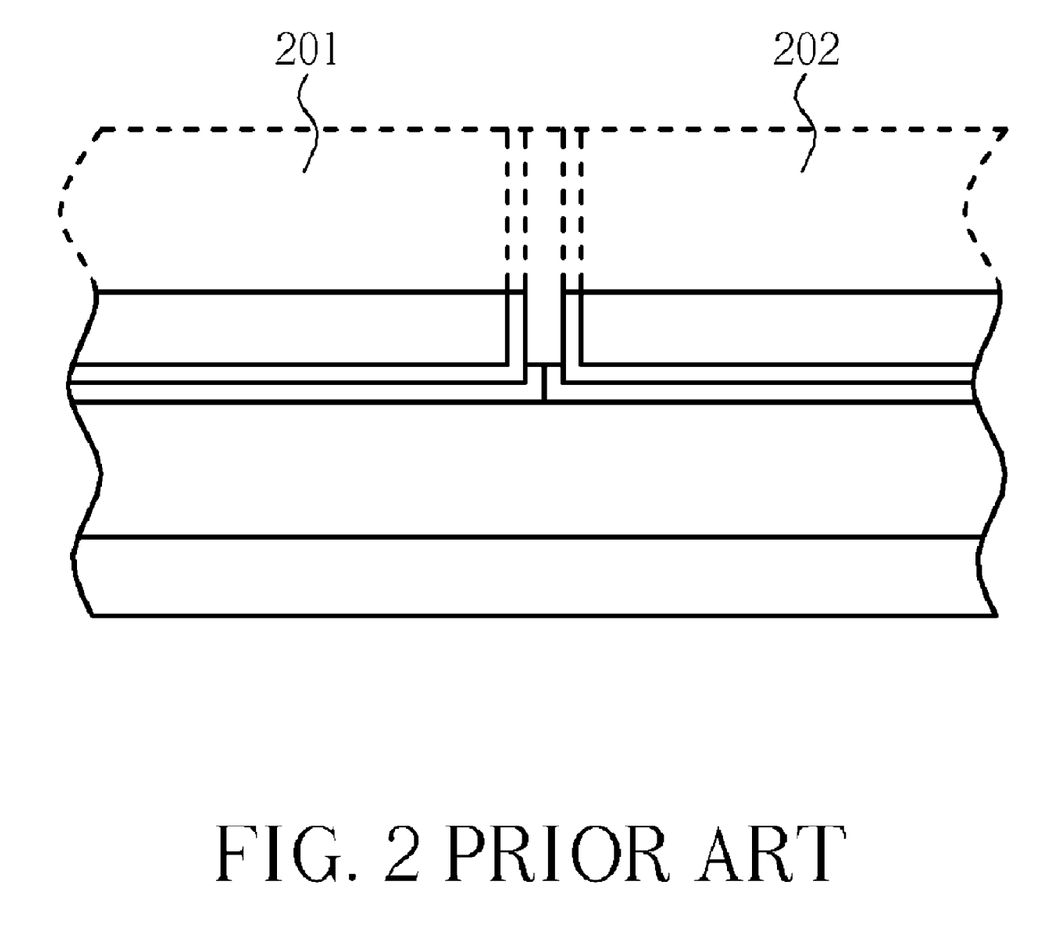
FIG. 2 illustrates a second electrical connection plan for electrically connecting the metal gates in a PMOS and NMOS in the prior art.

Another electrical connection plan is provided in U.S. Pat. No. 6,653,698. Space for the electrical connection is obtained by entirely back-etching the high-K materials and the metal gates in the PMOS 201 and the NMOS 202, as shown in FIG. 2. Because, however, the back-etching is non-selective in the absence of a photoresist, the uniform thickness is not easily controlled and the height of the semiconductor device is compromised.

Still another electrical connection plan is provided in U.S. Pat. No. 7,045,428. The high-K materials are directly converted into metals to realize the electrical connection between the metal gates.

In spite of the provided technical plans, a stable and reliable method is still needed to construct a sufficient electrical connection of the metal gates in the PMOS and the NMOS.

SUMMARY OF THE INVENTION

The present invention therefore provides a novel semiconductor element structure and a stable and reliable method to construct a sufficient electrical connection of the metal gates in the PMOS and the NMOS.

The semiconductor element structure of the present invention includes a first MOS having a first high-K material and a first metal for use in a first gate, a second MOS having a second high-K material and a second metal for use in a second gate and a bridge channel disposed in a recess connecting the first gate and the second gate for electrically connecting the first gate and the second gate, wherein the bridge channel is embedded in at least one of the first gate and the second gate.

The method for forming the semiconductor element structure of the present invention first provides a substrate including a first MOS and a second MOS, the gate electrode of the first MOS being connected to the gate electrode of the second MOS, wherein the first MOS includes a first high-K material and a first metal for use in a first gate, and a second MOS includes a second high-K material and a second metal for use in a second gate, then partially removes the first gate and the second gate to form a connecting recess, and afterwards fills the connecting recess with a conductive material to form a bridge channel for electrically connecting the first metal and the second metal.

Because the bridge channel in the novel semiconductor element structure of the present invention is located in the recess connecting the first gate and the second gate for electrically connecting the first gate and the second gate and is embedded in at least one of the first gate and the second gate, such a bridge channel will not change the height of the elements, and secures a sufficient electrical connection of each and every gate.

These and other objectives of the present invention will no doubt become obvious to those of ordinary skill in the art after reading the following detailed description of the preferred embodiment that is illustrated in the various figures and drawings.

DETAILED DESCRIPTION

The present invention provides a novel inter-gate connecting structure for use in the invertors and SRAMs. The bridge channel therein not only does not change the height of the elements but also secures a sufficient electrical connection of each and every gate.

Figure 3:
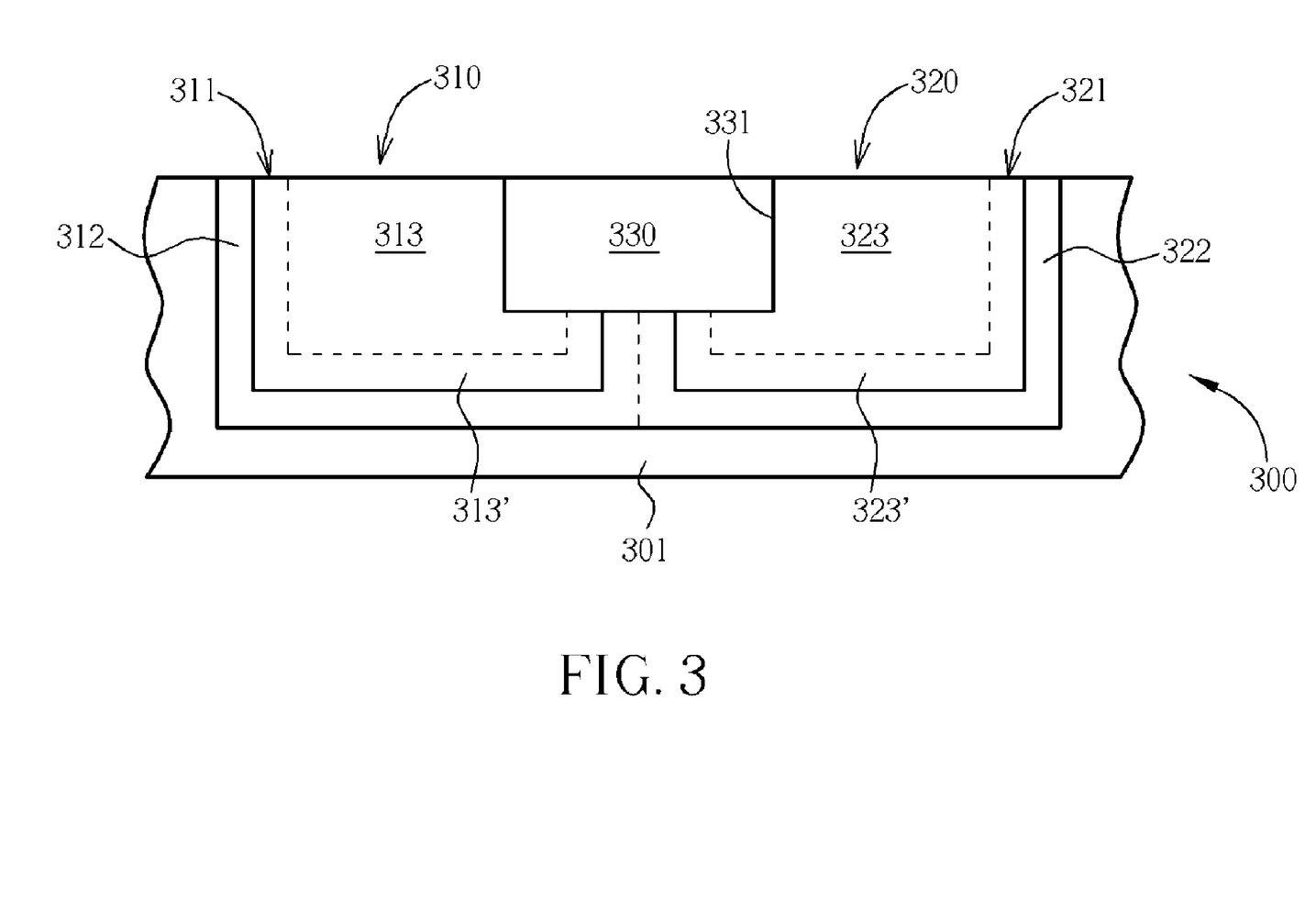
FIG. 3 illustrates a preferred embodiment of the semiconductor element structure of the present invention.

Please refer to FIG. 3, which illustrates a preferred embodiment of the present invention for use in the SRAMs. The semiconductor element structure 300 of the present invention includes a substrate 301, a first MOS 310, a second MOS 320 and a bridge channel 330. The first MOS 310 and the second MOS 320 respectively represent a PMOS and an NMOS and include any conventional elements, such as a source (not shown), a drain (not shown) and a gate. Please note that the assignment of the PMOS to the first MOS 310 and the NMOS to the second MOS 320 is arbitrary.

The first MOS 310 is disposed in the substrate 301 and includes a first high-K material 312 and a first metal 313 for a first gate 311. Similarly, the second MOS 320 is also disposed in the substrate 301 and includes a second high-K material 322 and a second metal 323 for a second gate 321. Preferably, the first gate 311 and the second gate 321 are connected to each other, so that the first high-K material 312 and the second high-K material 322 are sandwiched between the first metal 313 and the second metal 323.

The substrate 301 may be a semiconductor substrate, such as Si. The first high-K material 312 and the second high-K material 322 may be any suitable material with a high dielectric constant, such as $HfSi_xO_x$, HfSiON, $HfO_x$, $LaO_x$, $LaAl_xO_y$, $ZrO_x$, $ZrSi_xO_y$, $HfZr_xO4$, such as a material with a dielectric constant higher than 10. Similarly, the first metal 313 and the second metal 323 may be any single metal or composite metal, such as Al or W, that is suitable for the gate of an MOS, as shown in FIG. 3, depending on if the first MOS 310 and the second MOS 320 respectively represent a PMOS or an NMOS. If the first MOS 310 is a PMOS and the second MOS 320 is an NMOS, the first metal 313 may include a P-type metal 313', such as W, WN, Pt(Ni), TiN, Ru, and the second metal 323 may include an N-type metal 323', such as TaN, TaSiN, TaC, TiAlN, TiAl, Al. The P-type metal may have a work function of 4.9 eV-5.1 eV, and the N-type metal may have a work function of 4.0 eV-4.2 eV. As known by persons of ordinary skill or skilled in the art, the first gate 311 and the second gate 321 can be manufactured by the high-K/metal gate replacement procedure to form the high-K material and the metal in each gate. The details will not be described here.

The bridge channel 330 is disposed in a recess 331 for connecting the first gate 311 and the second gate 321 so that the bridge channel 330 may electrically connect the first gate 311 and the second gate 321. The minimum region of the connecting recess 331 is limited to the space of the first high-K material 312 and the second high-K material 322 of the first gate 311 and the second gate 321, or the connecting recess 331 may further partially occupies the first gate 311 and the second gate 321, for example, part of the first high-K material 312 and part of the second high-K material 322, and may further partially occupy at least one of the first metal 313 and the second metal 323. Accordingly, the bridge channel 330 in the recess 331 for connecting the first gate 311 and the second gate 321 is embedded in at least one of the first metal 313 and the second gate 323.

The bridge channel 330 may be formed of a metal to construct the electrical connection between the first gate 311 and the second gate 321, i.e. the first MOS 310 and the second MOS 320. The bridge channel 330 may be formed of any suitable metal for electrical connection, such as W, Al, TiAl, CoWP.

Because the bridge channel 330 is located in the recess 331 connecting the first gate 311 and the second gate 321, the size of the recess 331 is not fixed. Therefore, the recess 331 is unlikely to be too shallow to form a sufficient electrical connection. In addition, no back-etching is required to be performed on the first gate 311 and the second gate 321, so that uneven uniformity of the material for electrical connection is avoided. The present invention provides a stable and reliable solution to construct a sufficient electrical connection of the metal gates in the PMOS and the NMOS.

Figure 4:
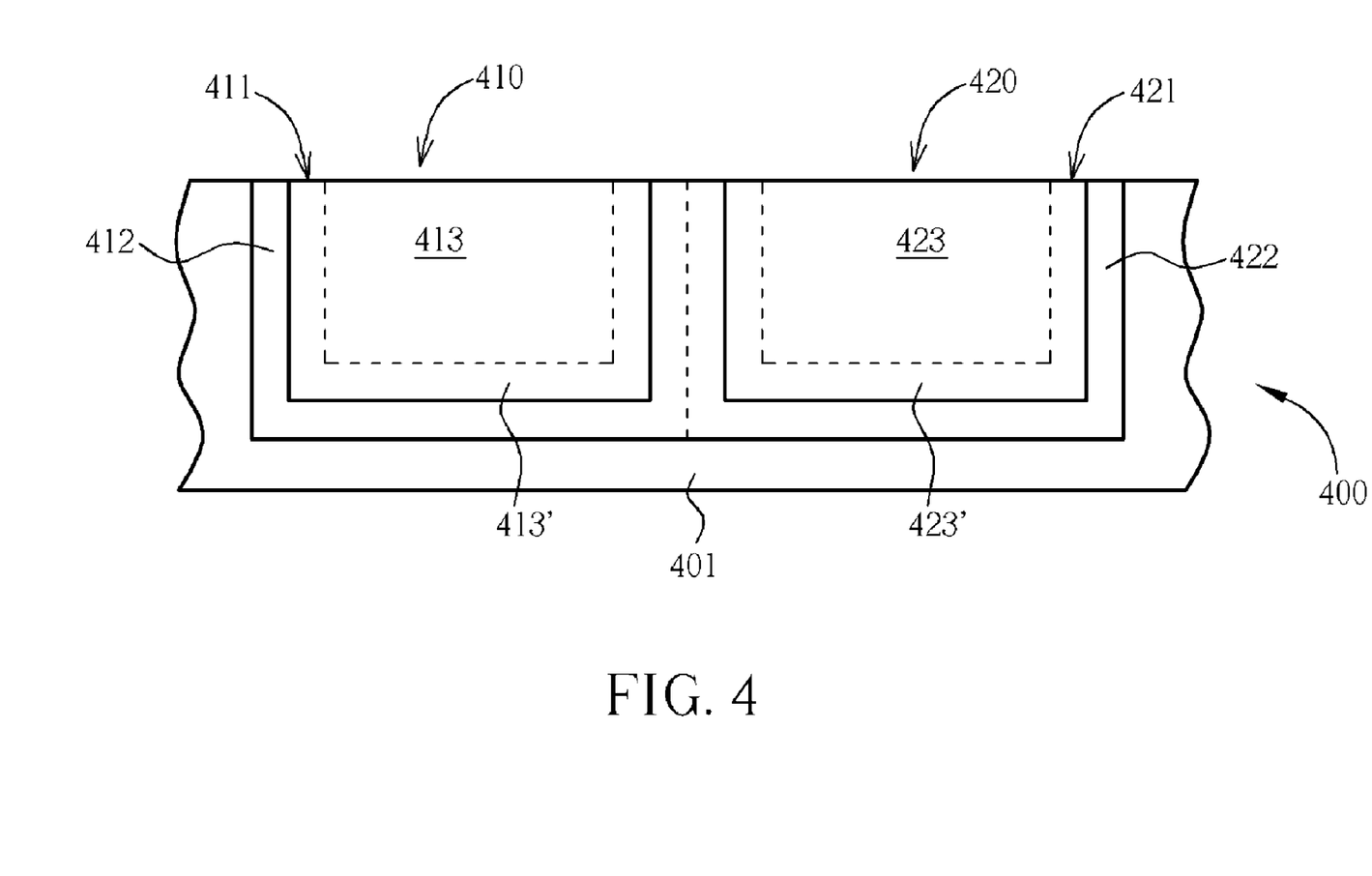
FIGS. 4-6 illustrate a preferred embodiment of the method for forming an SRAM structure according to the present invention.
Figure 5:
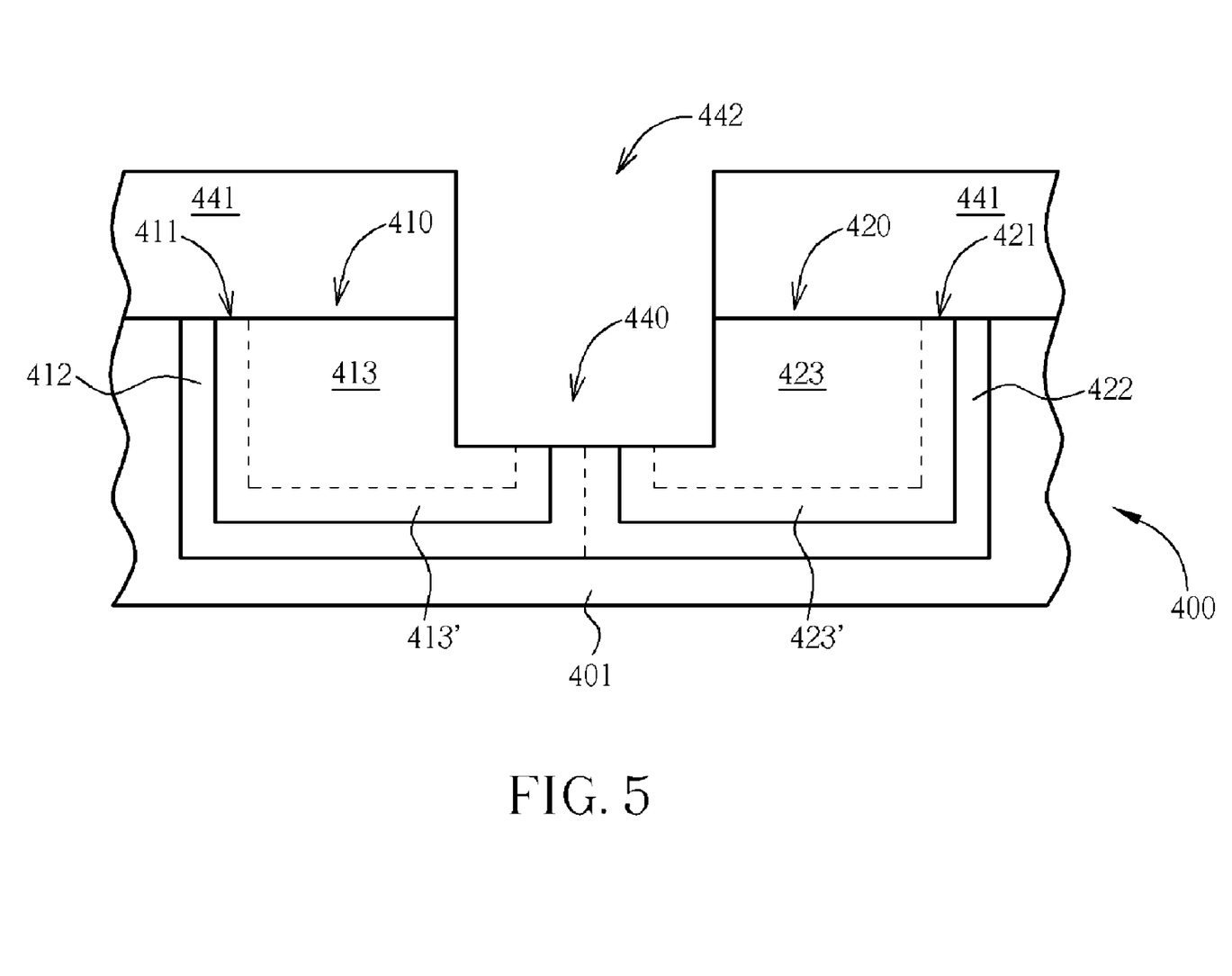
Figure 6:
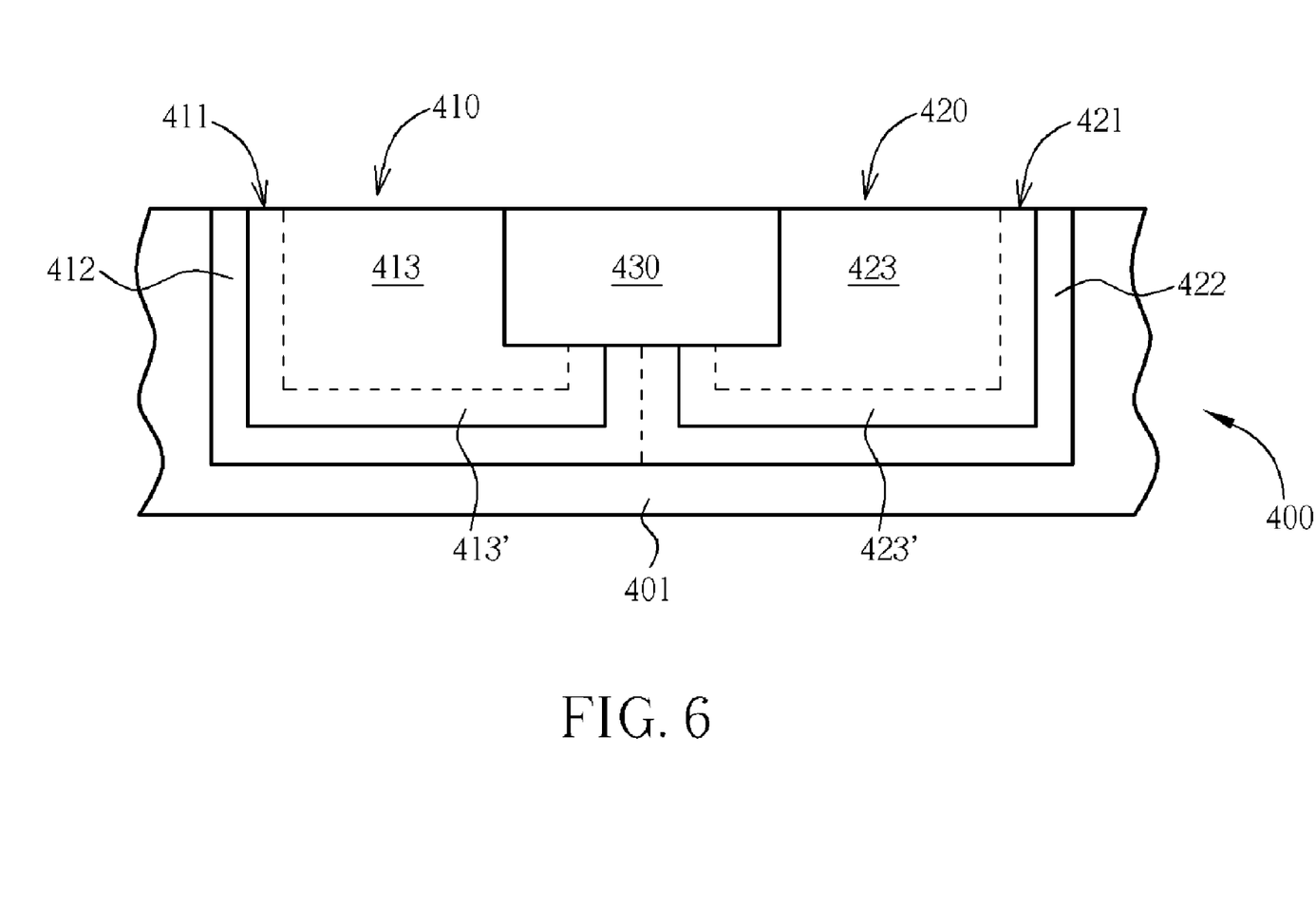

The present invention still provides a novel method for forming an inter-gate electrical connection structure, for example for forming an SRAM structure. FIGS. 4-6 illustrate a preferred embodiment of the method for forming an SRAM structure of the present invention. As shown in FIG. 4, the method for forming an SRAM structure 400 of the present invention first provides a substrate 401. A first MOS 410 and a second MOS 420 adjacent to the first MOS 410 are formed on the substrate 401. The first MOS 410 and the second MOS 420 may respectively represent a PMOS and an NMOS. Please note that the assignment of the PMOS to the first MOS 410 and the NMOS to the second MOS 420 is arbitrary.

The first MOS 410 may include any conventional elements, such as a source (not shown), a drain (not shown) or a first gate 411. The first MOS 410 includes a first high-K material 412 and a first metal 413 for use in a first gate 411. Similarly, the second MOS 420 may also include any conventional elements, such as a source (not shown), a drain (not shown) or a second gate 421. The second MOS 420 also includes a second high-K material 422 and a second metal 423 for use in a second gate 421. The first gate 411 and the second gate 421 are adjacent to each other, so that the first high-K material 412 and the second high-K material 422 are sandwiched between the first metal 413 and the second metal 423.

The substrate 401 may be a semiconductor substrate, such as Si or SiGe or GaAs. The first high-K material 412 and the second high-K material 422 may be any suitable material with a high dielectric constant, such as $HfSi_xO_x$, HfSiON, $HfO_x$, $LaO_x$, $LaAl_xO_y$, $ZrO_x$, $ZrSi_xO_y$, HfZrxO4, or a material with a dielectric constant higher than 10. Similarly, the first metal 413 and the second metal 423 may be any single metal or composite metal, such as Al or W, that is suitable for the gate of an MOS, as shown in FIG. 4, depending on if the first MOS 410 and the second MOS 420 respectively represent a PMOS or an NMOS. If the first MOS 410 is a PMOS and the second MOS 420 is an NMOS, the first metal 413 may include a P-type metal 413', such as W, WN, Pt (Ni), TiN, Ru, and the second metal 423 may include an N-type metal 423', such as TaN, TaSiN, TaC, TiAlN, TiAl, Al. The P-type metal may have a work function of 4.9 eV-5.1 eV, and the N-type metal may have a work function of 4.0 eV-4.2 eV. As known by persons of ordinary skill or skilled in the art, the first gate 411 and the second gate 421 may be manufactured by the high-K/metal gate replacement procedure to form the high-K material and the metal in each gate. The details will not be described here.

Then, as shown in FIG. 5, the first gate 411 and the second gate 421 (i.e. the first MOS 410 and the second MOS 420) are partially removed to form a connecting recess 440. For example, a photoresist 441 covers the semiconductor element structure 400 to form an opening 442 defining the connecting recess 440 in the photoresist 441 by an exposure and development procedure. Then, an etching procedure is performed to form the connecting recess 440 through the opening 442 on the photoresist 441. Finally, the photoresist 441 is stripped.

There are many options for the formation and location of the connecting recess 440. For example, a wet etching procedure, which can be selective or non-selective, may be used to form the connecting recess 440. The selective wet etching procedure may only selectively remove the first high-K material 412 and the second high-K material 422. On the other hand, the non-selective wet etching procedure may partially remove the first high-K material 412, the second high-K material 422, the first metal 413 and the second metal 423. The wet etching procedure may include multiple stages to partially remove the first high-K material 412, the second high-K material 422, the first metal 413 and the second metal 423.

On the other hand, a dry etching procedure, which can be selective or non-selective, may be used to form the connecting recess 440. The selective dry etching procedure may only selectively remove the first high-K material 412 and the second high-K material 422. On the other hand, the non-selective dry etching procedure may partially remove the first high-K material 412, the second high-K material 422, the first metal 413 and the second metal 423. For example, if the metal to be etched is W, the etching recipe may be $Cl_2+SF_6$. If the metal to be etched is Al, the etching recipe may be $Cl_2+BCl_3$.

Alternatively, an energy burning procedure, such as a laser, may be employed in the absence of a mask to form the connecting recess 440. The suitable size of the recess 440 is not fixed.

Afterwards, as shown in FIG. 6, a conductive material of low resistance, such as W, Al, TiAl, CoWP, is used to fill the recess 440 to form a bridge channel 430 for electrically connecting the first metal 413 and the second metal 423. The bridge channel 430 may be formed by many procedures, such as deposition or electroplating or electroless plating.

Because the size of the bridge channel 430 is optional, the bridge channel 430 is unlikely to be too shallow to form a sufficient electrical connection. In addition, no back-etching is required to be performed on the first gate 411 and the second gate 421, so that uneven uniformity of the material for electrical connection is avoided. The present invention provides a stable and reliable solution to construct a sufficient electrical connection of the metal gates in the PMOS and the NMOS.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for forming a semiconductor element structure, comprising:
    providing a substrate comprising a first MOS and a second MOS adjacent to said first MOS, wherein said first MOS comprises a first high-K material and a first metal for use in a first gate and said second MOS comprises a second high-K material and a second metal for use in a second gate;
    partially removing said first gate and said second gate to form a connecting recess; and
    filling said connecting recess with a conductive material to form a bridge channel for electrically connecting said first metal and said second metal, wherein said bridge channel is embedded in at least one of said first metal and said second metal.

2. The method of claim 1, wherein forming said connecting recess is carried out with the help of a photoresist.

3. The method of claim 1, wherein forming said connecting recess is carried out by using a wet etching.

4. The method of claim 3, wherein said wet etching only selectively removes said first high-K material and said second high-K material.

5. The method of claim 3, wherein said wet etching partially removes said first high-K material, said second high-K material, said first metal and said second metal.

6. The method of claim 3, wherein said wet etching which comprises multiple stages removes said first high-K material, said second high-K material, said first metal and said second metal.

7. The method of claim 3, wherein forming said connecting recess is carried out by using a dry etching.

8. The method of claim 7, wherein said dry etching only selectively removes said first high-K material and said second high-K material.

9. The method of claim 7, wherein said dry etching partially removes said first high-K material, said second high-K material, said first metal and said second metal.

10. The method of claim 1, wherein forming said connecting recess is carried out by using energy burning in the absence of a photoresist.

11. The method of claim 1, wherein forming said bridge channel is carried out by using an electroplating.

12. The method of claim 1, wherein forming said bridge channel is carried out by an electroless plating.

* * * * *

UNITED STATES PATENT AND TRADEMARK OFFICE
CERTIFICATE OF CORRECTION

| | | |
|---|---|---|
| PATENT NO. | : 7,998,818 B2 | |
| APPLICATION NO. | : 12/862799 | |
| DATED | : August 16, 2011 | |
| INVENTOR(S) | : Chiang et al. | |

It is certified that error appears in the above-identified patent and that said Letters Patent is hereby corrected as shown below:

On the title page, item (75), correct the residence of the fifth inventor from "Tainan County" to --Tainan City--.

Signed and Sealed this
Eleventh Day of October, 2011

David J. Kappos
*Director of the United States Patent and Trademark Office*